(12) United States Patent
Herchen

(10) Patent No.: US 6,529,362 B2
(45) Date of Patent: *Mar. 4, 2003

(54) MONOCRYSTALLINE CERAMIC ELECTROSTATIC CHUCK

(75) Inventor: Harald Herchen, San Jose, CA (US)

(73) Assignee: Applied Materials Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 131 days.

This patent is subject to a terminal disclaimer.

(21) Appl. No.: 08/920,423

(22) Filed: Aug. 29, 1997

(65) Prior Publication Data

US 2001/0046112 A1 Nov. 29, 2001

Related U.S. Application Data

(63) Continuation-in-part of application No. 08/812,194, filed on Mar. 6, 1997, now Pat. No. 5,737,178.

(51) Int. Cl.$^7$ ............................................. H02N 13/00
(52) U.S. Cl. ........................................................ 361/234
(58) Field of Search .............................. 361/233, 234; 279/128; 117/23, 54, 950; 427/420; 118/667, 401, 429, 500; 501/86

(56) References Cited

U.S. PATENT DOCUMENTS

| | | | |
|---|---|---|---|
| 3,701,636 A | 10/1972 | LaBelle, Jr. et al. | ..... 23/301 SP |
| 3,915,662 A | 10/1975 | LaBelle, Jr. et al. | ..... 23/301 SP |
| 4,184,188 A | 1/1980 | Briglia | ......... 361/234 |
| 4,384,918 A | 5/1983 | Abe | ............. 156/643 |
| 4,399,016 A | 8/1983 | Tsukada et al. | ......... 204/192 R |
| 4,480,284 A | 10/1984 | Tojo et al. | ............ 361/234 |
| 4,502,094 A | 2/1985 | Lewin et al. | ............... 361/234 |
| 4,565,600 A | 1/1986 | Ricard | |
| 5,055,964 A | 10/1991 | Logan et al. | ............ 23/301 SP |
| 5,207,437 A | 5/1993 | Barnes et al. | ................. 279/128 |
| 5,213,349 A | 5/1993 | Elliot | .......................... 156/643 |
| 5,413,360 A * | 5/1995 | Atari et al. | .................. 361/234 |
| 5,426,558 A * | 6/1995 | Sherman | .................. 361/234 |
| 5,452,177 A * | 9/1995 | Frutiger | ..................... 361/234 |
| 5,455,062 A | 10/1995 | Mühlfriedal et al. | |
| 5,535,090 A * | 7/1996 | Sherman | ..................... 361/234 |
| 5,557,215 A | 9/1996 | Saeki et al. | ............. 204/192 R |
| 5,595,241 A | 1/1997 | Jelinek | .................... 23/301 SP |
| 5,654,041 A | 8/1997 | Appich et al. | |
| 5,671,116 A * | 9/1997 | Husain | ........................ 361/234 |
| 5,737,178 A * | 4/1998 | Herchen | ..................... 361/234 |
| 5,754,391 A * | 5/1998 | Bates | ......................... 361/234 |

FOREIGN PATENT DOCUMENTS

| | | |
|---|---|---|
| EP | 0171011 | 1/1986 |
| EP | 0512936 | 11/1992 |
| EP | 0753494 A1 | 1/1997 |
| EP | 0753494 | 1/1997 |
| EP | 0755066 | 1/1997 |
| JP | 09293774 | 11/1997 |
| JP | 09293774 | 2/1998 |
| WO | WO9744891 | 11/1997 |

OTHER PUBLICATIONS

PCT Search Report dated Feb. 18, 2000.
H.E. LaBelle, Jr., "EFG, the Invention and Application to Sapphire Growth"; pp. 8–17; published by Saphikon, Inc.; received Jun. 7, 1979; manuscript received in final form Oct.30, 1979.

* cited by examiner

Primary Examiner—Fritz Fleming
(74) Attorney, Agent, or Firm—Janah & Associates

(57) ABSTRACT

An electrostatic chuck 20 for holding a substrate 12 in a process chamber, comprises a unitary monolithic structure 25 of monocrystalline ceramic. The monocrystalline monolith has an electrode 45 embedded therein for electrostatically holding the substrate 12 upon application of a voltage thereto. An electrical connector 50 extends through the unitary monolithic structure 25 for supplying a voltage to the electrode 45. In one version, the monolithic structure 25 is made from a single piece of monocrystalline ceramic formed by a melt forming process. In another version, the monolithic structure 25 comprises a plurality of monocrystalline ceramic plates 270 bonded to one another to form the monolithic structure 25. Preferably, the monolithic structure 25 comprises monocrystalline sapphire and the electrode 45 comprises a refractory metal.

114 Claims, 7 Drawing Sheets

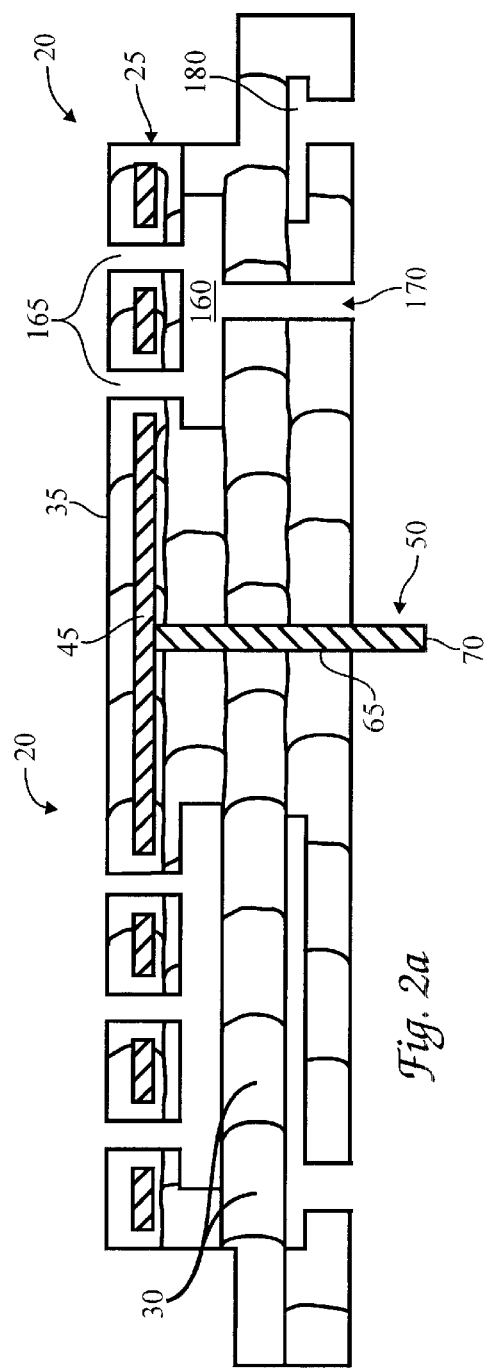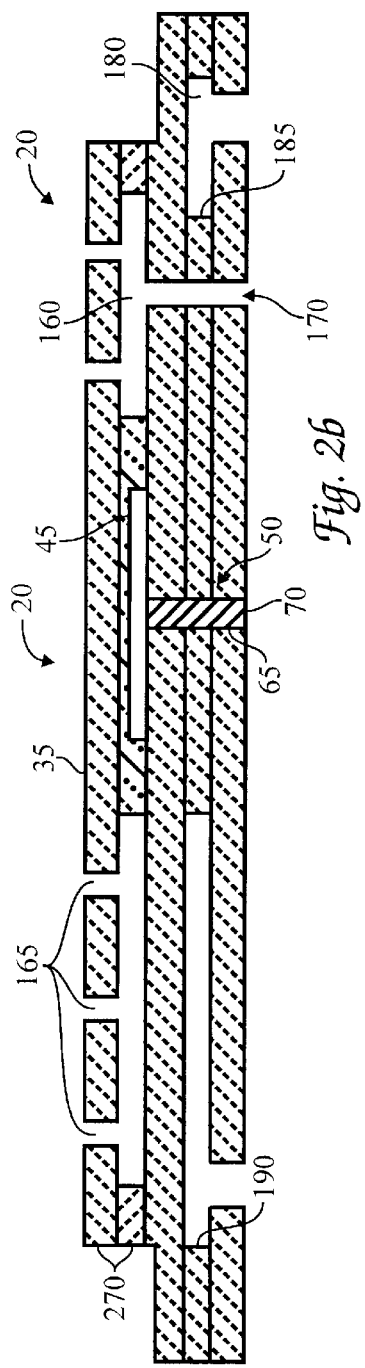

MONOCRYSTALLINE CERAMIC ELECTROSTATIC CHUCK

CROSS-REFERENCE

This application is a continuation-in-part of U.S. patent application Ser. No. 08/812,194 entitled "MONOCRYSTALLINE CERAMIC COATING HAVING INTEGRAL BONDING INTERCONNECTS FOR ELECTROSTATIC CHUCKS," filed on Mar. 6, 1997, which is incorporated herein by reference, now U.S. Pat. No. 5,737,178.

BACKGROUND

The present invention relates to electrostatic chucks useful for holding substrates during processing.

Electrostatic chucks are used to hold semiconductor substrates, such as silicon wafers, in a process chamber. A typical electrostatic chuck comprises an electrode covered by a dielectric layer. In monopolar chucks, an attractive electrostatic force is generated when the electrode of the chuck is electrically biased by a voltage and an electrically charged plasma in the chamber induces electrostatic charge in the substrate. A bipolar chuck comprises bipolar electrodes that are electrically biased relative to one another to generate the electrostatic attractive force.

The electrostatic attractive force generated by electrostatic chucks can also be of different types. As schematically illustrated in FIG. 1a, a chuck 10a having a dielectric layer 11 with a high electrical resistance results in coulombic electrostatic forces where opposing electrostatic charges accumulate in the substrate 12 and in the electrode 13 of the chuck. The coulombic electrostatic force is described by the equation:

$$F = \frac{1}{2} \varepsilon_0 \varepsilon_r \left(\frac{V}{t}\right)^2 A$$

where $\varepsilon_0$ and $\varepsilon_r$ are the dielectric constant of vacuum and relative dielectric constant of the dielectric layer 11, respectively, V is the voltage applied to the electrode 13, A is the area of the electrode, and t is the thickness of the dielectric layer.

With reference to FIG. 1b, Johnsen-Rahbek electrostatic attraction forces occur in the chuck 10b when an interface 14 between a low resistance or leaky dielectric layer 15 and the substrate 12, has an interfacial contact resistance much greater than the resistance of the dielectric layer 15, i.e., when the resistance of the dielectric layer 15 is typically from about $10^{11}$ to about $10^{14}$ Ω/cm. Free electrostatic charge drifts through the dielectric layer 15 in the applied electric field, and accumulates at the interface of the dielectric layer 15 and the substrate 12. The charge accumulated at the interface generates a potential drop represented by the equation:

$$F = \frac{1}{2} \varepsilon_0 \left(\frac{V}{\delta}\right)^2 A$$

where δ denotes the contact resistance of the air gap 14 between the substrate 12 and the low resistance dielectric layer 15. The Johnsen-Rahbek electrostatic attractive force is typically higher than that provided by coulombic forces, because polarization in the dielectric layer 15, and free charges accumulated at the interface 14 combine to enhance electrostatic force. This provides a stronger electrostatic force that more securely holds the substrate 12 onto the chuck and also improves thermal transfer rates at the interface. Also, the lower voltages used in these chucks reduce charge-up damage to active devices on the substrate 12.

The dielectric layers 11, 15 covering the electrode 13 of these chucks typically comprise a thin polymer film, such as polyimide, adhered to the electrode, as for example disclosed in U.S. Pat. No. 5,745,331, patent application Ser. No. 08/381,786, entitled "Electrostatic Chuck with Conformal Insulator Film," filed on Jan. 31, 1995, to Shamouilian, et al., which is incorporated herein by reference. However, the substrate held on the chuck often breaks or chips to form fragments having sharp edges that puncture the polymer film and expose the electrode. Exposure of the electrode at even a single pinhole in the dielectric layer can cause arcing between the electrode and plasma, and require replacement of the entire chuck. Polymers also have a limited lifetime in erosive process environments, such as processes using oxygen-containing gases and plasmas. Also, polymers or adhesives used to bond the polymer films to the chuck often cannot operate at elevated temperatures exceeding 1000° C.

Polycrystalline ceramics have also been used to form the dielectric layer to provide increased puncture resistance and higher temperature performance, as for example, described in U.S. Pat. No. 5,280,156 to Niori; Watanabe, et al., in "Relationship between Electrical Resistivity and Electrostatic Force of Alumina Electrostatic Chuck," *Jpn. J. Appl. Phys.*, Vol. 32, Part 1, No. 2, (1993); or "Resistivity and Microstructure of Alumina Ceramics Added with $TiO_2$ Fired in Reducing Atmosphere," *J. of the Am. Cer. Soc. of Japan Intl. Ed.*, Vol. 101, No. 10, pp. 1107–1114 (July 1993); all of which are incorporated herein by reference. The ceramic dielectric layers typically comprise a low conductivity polycrystalline ceramic, such as a mixture of $Al_2O_3$ and $TiO_2$, or $BaTiO_3$. However, polycrystalline ceramics such as $Al_2O_3$ doped with $TiO_2$ often have an electrical resistance that changes with temperature, and can exhibit low or insufficient electrical resistance at high temperatures. Also, polycrystalline ceramics comprise small grains or crystals that typically have a diameter of 0.1 to 50 microns, and have grain boundaries containing a mixture of glassy materials that hold the grains together. When such ceramic layers are exposed to erosive environments, such as a fluorine containing plasma, the plasma etches away the grain boundary regions causing the ceramic grains to loosen and flake off during processing of the substrate. Abrasion of the substrate against the chuck can also cause ceramic grains to flake off the chuck. These particulate ceramic grains contaminate the substrate and/or process chamber and reduce the yields of integrated circuit chips from the substrate.

Dielectric layers comprising a thin wafer of monocrystalline ceramic that is made of a few, relatively large, ceramic crystals have also been used to cover the electrode. For example, U.S. Pat. No. 5,413,360 to Atari, et al., describes an electrostatic chuck consisting of a monocrystalline ceramic wafer covering an electrode on a dielectric plate. Atari teaches that a bonding agent, or a high temperature joining method, is used to join the monocrystalline ceramic wafer to the electrode of the chuck. In another example, U.S. Pat. No. 5,535,090 to Sherman, filed Mar. 3, 1994, discloses an electrostatic chuck comprising small segments of monocrystalline ceramic wafers adhered to the surface of an electrode using a high temperature vacuum braze with a suitable brazing alloy. For example, a platinum layer can be sputtered onto the monocrystalline ceramic layer and a platinum paste used to adhere the monocrystalline ceramic layer to the metal electrode.

One problem with such chucks arises from their structure, which typically comprises a single relatively thin monocrystalline ceramic wafer bonded to the metal electrode with a layer of bonding material therebetween, and supported by a metal or dielectric plate made from another material. During the bonding process or during use of the chuck in an erosive process environment, the thermal expansion mismatch between the monocrystalline ceramic wafer and the electrode can result in failure of the bond. Also, the bonding material is typically a metal based material that thermally or chemically degrades during use of the chuck in reactive processes, causing failure of the chuck and movement or misalignment of the substrate during processing. The thin monocrystalline ceramic wafer and electrode can also separate from the supporting dielectric or metal plate at high temperatures due to stresses arising from the thermal expansion coefficient mismatches. Another problem arises because grooves, channels, and other hollow spaces which are used to hold coolant or to supply helium gas to the interface below the substrate, are difficult to form in the brittle, hard, and thin monocrystalline ceramic layers. During the series of machining or drilling steps that are used to form these hollow shapes, the brittle layers often crack or chip resulting in loss of the chuck. It is also difficult to precisely machine fine holes or grooves in the monocrystalline ceramic wafer.

Yet another problem with such conventional chucks arises from the method of fabrication of the monocrystalline ceramic wafers. In one method, the Czochralski-type method, large crystals of monocrystalline ceramic are drawn from molten alumina using a seed crystal mounted on a die. The drawn out material cools and solidifies to form a column of large and oriented crystals. Thereafter, the column is sliced to form monocrystalline ceramic wafers. Another method commonly known as the EFG process (edge-defined, film fed, growth process) is taught for example, by U.S. Pat. Nos. 3,701,636 and 3,915,662 to La Bella, et al., both of which are incorporated herein by reference. In these methods, a single crystal of monocrystalline ceramic is drawn from molten alumina, using a die such as an annular ring contacting the molten alumina in a capillary tube. The molten alumina rises in the tube via capillary forces and the die provides a seeding surface from which the monocrystalline ceramic crystal is grown. However, the size of the monocrystalline ceramic crystal grown by these methods is restricted by the dimensions of the size of the die opening, preventing growth of large monocrystalline ceramic crystals need for large diameter chucks. The fabrication methods can also produce crystals having relatively small grains and with facet defects. Also, the drawn out crystal can twist and turn during the drawing out process to provide a disoriented and faceted crystalline structure.

It is desirable to have a chuck made of monocrystalline ceramic that exhibits reduced thermal expansion mismatch, low rates of erosion in plasma environments, and reduced particulate generation during use in semiconductor processing. It is also desirable for the monocrystalline ceramic used in the chuck to provide stable and reliable electrical properties at high operating temperatures, preferably exceeding about 1000° C. It is further desirable to have predefined shapes of grooves, slots and channels for holding cooling fluid or helium gas in the body of the chuck to regulate the temperatures of the substrate and chuck.

SUMMARY

An electrostatic chuck of the present invention comprises monocrystalline ceramic material that exhibits reduced erosion and resistant particle generation, and provides stable electrical properties at high operating temperatures. The electrostatic chuck comprises a unitary monolith of monocrystalline ceramic having a receiving surface for receiving a substrate. An electrode is embedded in the unitary monolith for electrostatically holding the substrate upon application of a voltage thereto. An electrical connector extending through the unitary monolith is used to supply the voltage to operate the electrode.

The electrostatic chuck can be fabricated by solidification of molten ceramic or from a plurality of monocrystalline ceramic plates bonded to one another to form a monolithic structure. Preferably, the monocrystalline ceramic comprises large crystals having a diameter of about 0.5 to about 10 cm, and which are substantially oriented to one another in a single crystallographic direction. The electrode of the chuck can comprise a pattern of lattice defects induced in the ceramic plates, a pattern of dopant in the ceramic plates, or an electrode made of conducting metal. The monolithic chuck can be operated at elevated temperatures with little or no contamination of the substrate.

One method of forming the monocrystalline chuck comprises forming a plurality of monocrystalline ceramic plates comprising, for example, sapphire crystals substantially oriented to one another. An electrode is formed on one or more of the monocrystalline ceramic plates. The monocrystalline ceramic plates are bonded to one another to form a monolithic structure having the electrode embedded therein. The plates can be bonded to one another by applying a bonding compound comprising aluminum oxide to the monocrystalline ceramic plates and heat treating the bonding compound. Preferably, the bonding compound comprises an eutectic mixture of aluminum oxide and eutectic component, the eutectic mixture having a melting temperature of less than about 2000° C.

In another method for forming the electrostatic chuck, ceramic material is melted in a mold to form molten ceramic. The mold has an internal shape of an electrostatic chuck. One or more of electrode forms, channel forms, and conduit forms are suspended in the molten ceramic, and a seeding crystal is maintained in contact with the molten ceramic. The molten ceramic is directionally cooled to form monocrystalline ceramic comprising large crystals substantially oriented to one another, and having the electrode forms, channel forms, or conduit forms embedded therein. One or more of the electrode, channel, or conduit shaping forms in the monocrystalline ceramic are then suitably treated, for example, in an oxidation heat treatment or wet chemical etching process, to form a unitary monolith of monocrystalline ceramic having an electrode, and channels or conduits for holding heat transfer fluid or gas, respectively. The method provides an intermediate product comprising a unitary monolithic monocrystalline ceramic having embedded therein one or more chemically erodible forms that are shaped to form channels and conduits in the unitary monolithic monocrystalline ceramic.

In another aspect useful for regulating the temperature of a substrate, the electrostatic chuck comprises a dielectric member having an electrode embedded therein, and a receiving surface for receiving the substrate. The dielectric member comprises a fluid conduit for circulating heat transfer fluid in the chuck. Preferably, the fluid conduit comprises first passageways at a distance $D_1$ from the receiving surface, and second passageways at a distance $D_2$ from the receiving surface, the distance $D_1$ being greater than the distance $D_2$. A fluid inlet supplies heat transfer fluid to the conduit and a fluid outlet removes the heat transfer fluid. The temperature of a substrate held on a receiving surface of the electrostatic chuck is regulated by supplying heat transfer fluid through first passageways that are at a distance $D_1$ from the receiving surface, and removing the heat transfer fluid from second passageways that are at a distance $D_2$ from the receiving surface. The distance $D_1$ is sufficiently greater than the distance $D_2$ to compensate for a rise in temperature, or cooling of, of the heat transfer fluid as it circulates through the chuck.

DRAWINGS

These features, aspects, and advantages of the present invention will become better understood with regard to the following description, appended claims, and accompanying drawings which illustrate examples of the invention, where:

FIG. 2a is a schematic sectional side view of an embodiment of an electrostatic chuck of the present invention;

FIG. 2b is a schematic sectional side view of another embodiment of an electrostatic chuck of the present invention;

DESCRIPTION

Figure 1B:
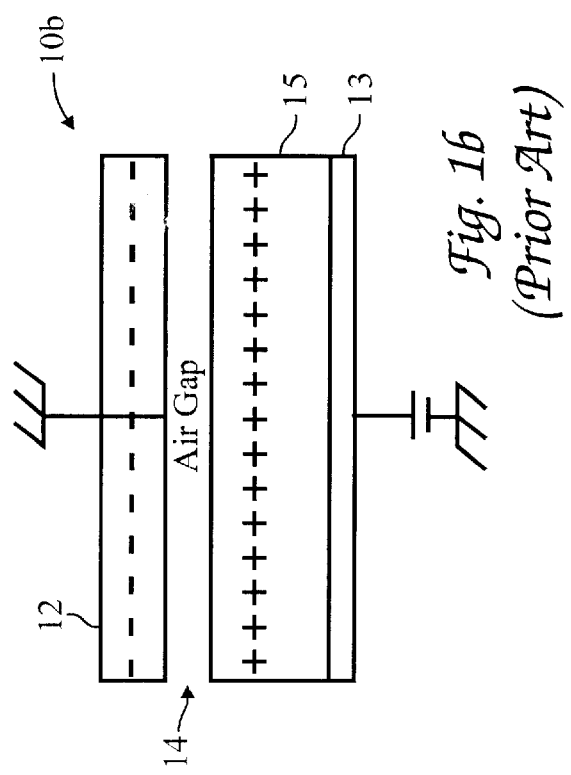
FIG. 1b (Prior Art) is a schematic view of an electrostatic chuck that operates using Johnsen-Rahbek electrostatic forces.
Figure 1A:
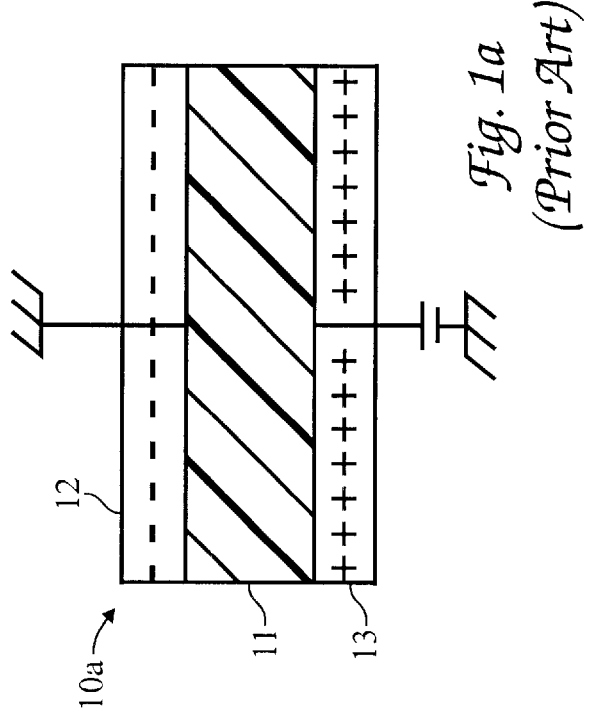
FIG. 1a (Prior Art) is a schematic view of an electrostatic chuck that operates using coulombic electrostatic forces.

The present invention relates to an electrostatic chuck 20 and a method of fabricating a monolithic structure 25 of monocrystalline ceramic material, which comprises relatively large ceramic crystals 30 that are oriented with respect to one another, as schematically represented in FIG. 2a. The electrostatic chuck 20 of monocrystalline ceramic material comprises a receiving surface 35 for receiving a substrate 12 thereon, and one or more electrodes 45 below and covered by the receiving surface 35. As shown in FIG. 2a, the electrostatic chuck 20 electrostatically holds a substrate 12 to the receiving surface 35 upon application of a voltage to the electrode 45 via an electrical connector 50 that extends through the monolithic structure 25. It should be noted that although use of the method of the present invention is illustrated by an electrostatic chuck 20, the invention can also be used to fabricate monocrystalline ceramic structures for other electronic, magnetic, and mechanical applications, as apparent to those skilled in the art, without deviating from the scope of the invention. Thus the present invention should not be limited to the illustrative embodiments of the invention described herein.

The monolithic structure 25 of monocrystalline ceramic comprises one or more monoliths, each monolith comprising unitary block of a chemically homogeneous structure that has several advantages in modern integrated circuit fabrication processes. The term "monocrystalline" commonly refers to a single crystal material or one that comprises a few (typically 10 or fewer) large ceramic crystals 30 that are oriented in the same crystallographic direction, i.e, having crystallographic planes with miller indices that are aligned to one another. The large crystals 30 within the "monocrystalline" ceramic material typically have an average diameter of about 0.5 to about 10 cm, and more typically from 1 to 5 cm. In contrast, conventional polycrystalline ceramic materials have small grains or crystals with diameters on the order of 0.1 micron to 50 micron, which is smaller by a factor of at least about $10^2$ to about $10^6$. The ceramic crystals 30 in the monolithic structure 25 are oriented in substantially the same single crystallographic direction, and provide exposed surfaces having little or no impurity or glassy grain boundary regions that can erode rapidly in erosive halogen containing environments. The continuous and uniform crystallographic structure provided by the receiving surface 35 of the monolithic structure 25 exhibits reduced erosion or particulate generation in erosive environments and provides a relatively constant electrical resistance that does not change at higher temperatures, unlike other polycrystalline ceramic materials.

The highly oriented monolithic structure 25 has a resistivity sufficiently high to electrically insulate the electrode 45. The resistivity of the monolithic structure 25 is preferably from about $1 \times 10^8$ to about $1 \times 10^{20}$ $\Omega$/cm, and more preferably from about $1 \times 10^{11}$ to about $1 \times 10^{13}$ $\Omega$/cm; and is tailored to provide a resistance suitable for forming either a coulombic chuck (high resistance) or Johnsen-Rahbek chuck (low resistance). The monolithic structure 25 reduces particle generation during processing, provides excellent erosion resistance in erosive halogen-containing plasma environments, and exhibits consistent electrical resistance values at high temperatures. Suitable monocrystalline ceramic materials include monocrystalline $Al_2O_3$, AlN, $BaTiO_3$, BeO, BN, CaO, $LaB_6$, MgO, $MoSi_2$, $Si_3N_4$, $SiO_2$, $Ta_2O_5$, $TiB_2$, TiN, $TiO_2$, $TiSi_2$, $VB_2$, $W_2B_3$, $WSi_2$, $ZrB_2$, or $ZrO_2$. Preferably, the monolithic structure 25 comprises monocrystalline sapphire, which is a crystal form of alumina that exhibits excellent chemical and erosion resistance in erosive environments, particularly halogen plasma environments. Monocrystalline sapphire also has a very high melting temperature that allows high temperature use at temperatures exceeding 1000° C. and often even exceeding 2000° C. The monolithic structure 25 can also be mixed with suitable dopants to provide the desired electrical properties such as resistivity and dielectric breakdown strength. For example, whereas pure sapphire has a resistivity on the order of $1 \times 10^{14}$ $\Omega$/cm, sapphire can be mixed with 1 to 3 wt % $TiO_2$ to provide a lower resistivity on the order of $1 \times 10^{11}$ to $1 \times 10^{13}$ $\Omega$/cm, which is more suitable for use in Johnsen-Rahbek-type electrostatic chucks.

The electrode 45 of the chuck 20 can comprise a pattern of dopant material, a pattern of lattice defects, or a metal structure embedded in the monolithic structure 25. Suitable metal electrodes 45 can be made from copper, nickel, chromium, aluminum, molybdenum, and combinations thereof. In a preferred version, the electrode 45 comprises a refractory metal having a melting point of at least about 2200° C. to facilitate fabrication of the chuck 20, the thickness of the electrode being from about 1 $\mu$m to about 100 $\mu$m, and more typically from 1 $\mu$m to 50 $\mu$m. For a substrate 12 having a diameter of 200 to 300 mm (6 to 8 inches), the electrode 45 typically covers a total area of about 7,000 to about 70,000 sq. mm. Preferably, the electrode 45 comprises small apertures that are sized (i) sufficiently small to allow the electrode to generate a uniform electrostatic field for holding the substrate 12 upon application of a voltage thereto, and (ii) sufficiently large to allow the monolithic structure 25 to form a strong and cohesive structure joined by the interconnects extending through the apertures. Electrical connectors 50 that are used to electrically connect the electrode 45 to a chuck voltage supply 60, comprise an (i) electrical lead 65 that extends through the monolithic structure 25 and (ii) an electrical contact 70 at the end of the lead. Typically, the length of the electrical lead 65 is from about 10 mm to about 50 mm, and the width of the electrical lead is from about 0.2 mm to about 10 mm.

Figure 3:
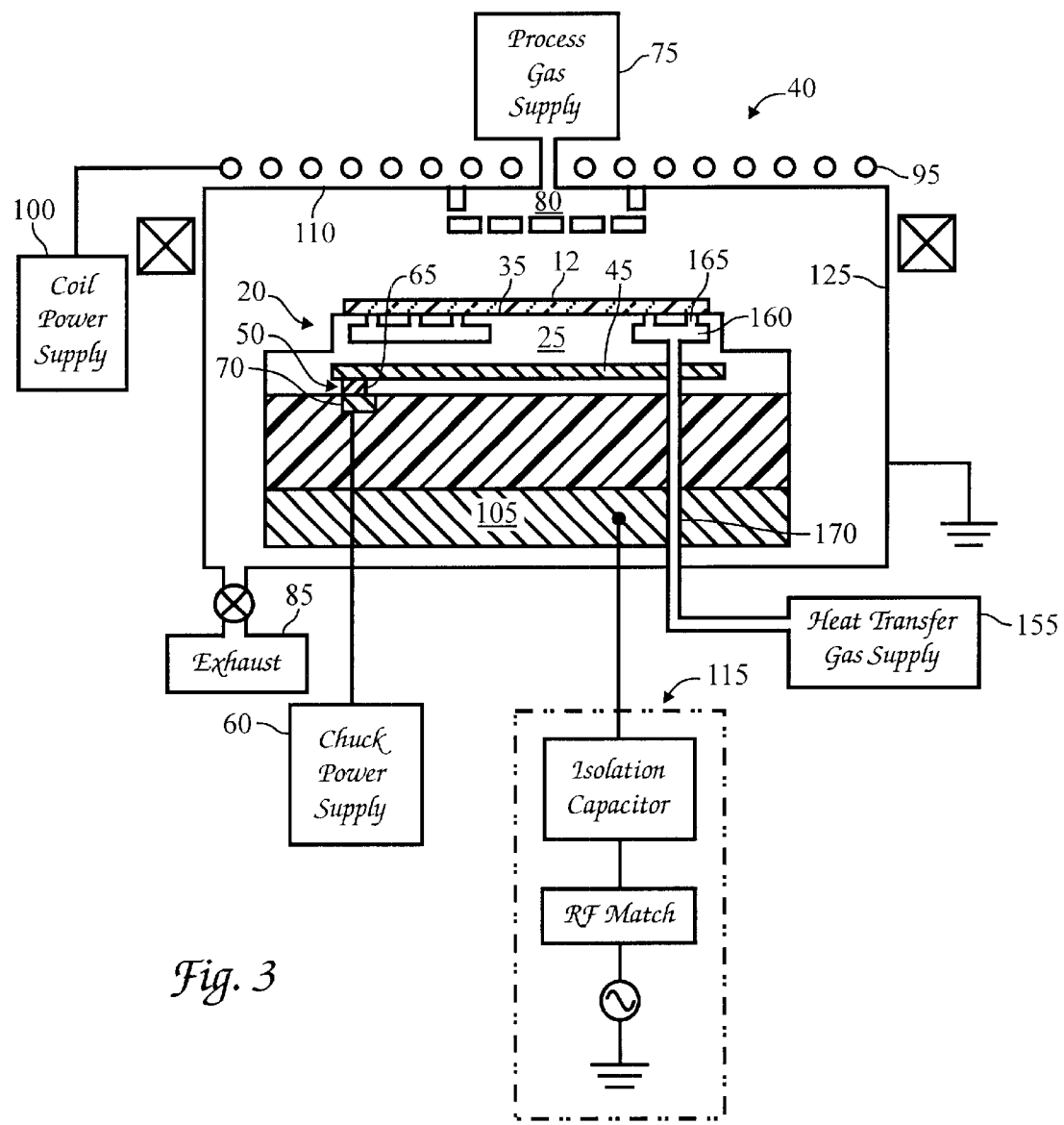
FIG. 3 is a schematic sectional side view of a process chamber comprising a monopolar chuck of the present invention.
Figure 4:
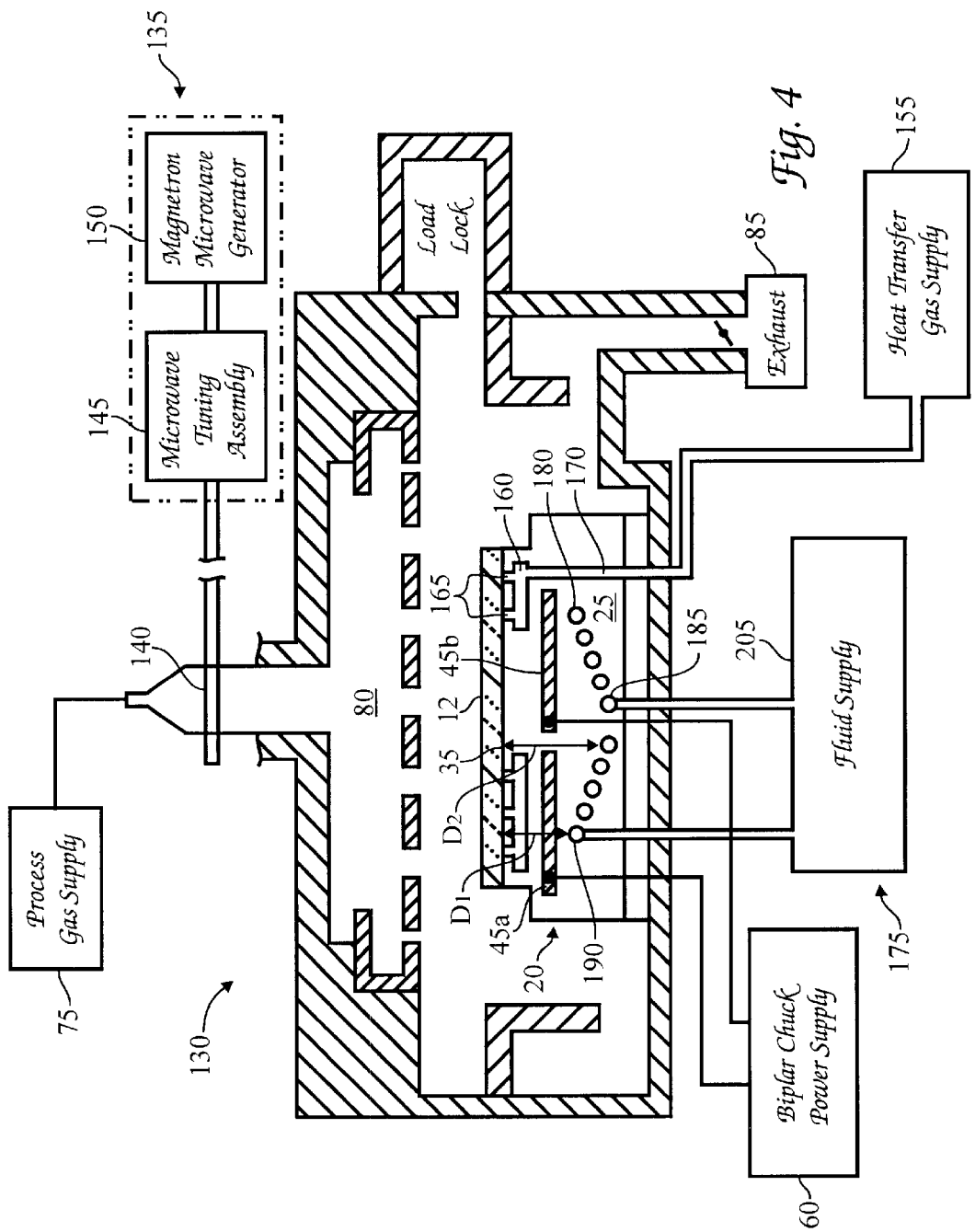
FIG. 4 is a schematic sectional side view of a process chamber comprising a bipolar chuck of the present invention.

With reference to FIG. 3, operation of the chuck 20 of the present invention having a monopolar electrode 45 will be described in the context of holding semiconductor substrates 12 in a plasma process chamber 40. The chamber 40 illustrated in FIG. 3 represents a CENTURA 5200 oxide etch chamber commercially available from Applied Materials Inc., Santa Clara, Calif., as described in commonly assigned patent application Ser. No. 07/941,507, filed on Sept. 8, 1992 now abandoned, which is incorporated herein by reference. The process chamber 40 typically includes a process gas supply 75 for introducing process gas into the chamber via a gas distributor 80, and a throttled exhaust 85 for exhausting gaseous byproducts from the chamber. A plasma is formed from the process gas using a plasma generator that couples an electric field into the chamber 40. The plasma generator can comprise an inductor coil 95 capable of forming an inductive electric field in the chamber 40 when powered by a coil power supply 100. Alternatively, the chamber 40 can include cathode and anode electrodes 105, 110 that are used to generate a capacitive electric field in the process chamber 40 when powered by an RF power supply 115. The cathode electrode 105 can be the same electrode as the electrode 45 embedded in the chuck 20 (as shown in FIG. 4), or a separate electrode below the chuck 20 (as shown in FIG. 3). The capacitive electric field formed by the electrodes 105, 110 is perpendicular to the plane of the substrate 12 and accelerates inductively formed plasma species toward the substrate 12. The frequency of the RF voltage applied to the process electrodes, and/or the inductor coil 95, is typically from about 50 kHz to about 60 MHZ, and more typically about 13.56 MHZ. The power of the RF voltage applied to the coil 95 or process electrodes 105, 110 is typically from about 100 to about 5000 Watts. A combination of both inductor coils 95 and process electrodes 105, 110 is used to provide control of both the plasma density and the plasma energy of the plasma ions.

The process chamber 40 is evacuated and maintained at a subatmospheric pressure and a robot arm (not shown) transports a substrate 12 from a load-lock transfer chamber through a slit valve and into the chamber. The robot arm places the substrate 12 on the tips of lift fingers (not shown) are elevated by the pneumatic lift mechanism to extend about 2 to 5 centimeters above the surface of the chuck 20. The pneumatic mechanism lowers the substrate 12 onto the chuck 20, and the electrode 45 of the chuck is electrically biased with respect to the substrate by the chuck voltage supply 60. The voltage applied to the monopolar electrode 45 shown in FIG. 3 causes electrostatic charge to accumulate in the electrode or in the monocrystalline ceramic material covering the electrode. The plasma in the chamber 40 provides electrically charged species having opposing polarity which accumulate in the substrate 12. The accumulated opposing electrostatic charges result in an attractive electrostatic force that electrostatically holds the substrate 12 to the chuck 20. On completion of processing, the pneumatic lifting apparatus raises the lift pins which lift the substrate 12 to allow the substrate to be removed by the robotic arm. Before raising the lift pins, the substrate is electrically decoupled or dechucked from the chuck 20 by dissipating the residual electrical charges holding the substrate onto the chuck after the voltage to the electrode 45 is turned off. Typically, the chucking voltage supply 60 is turned off, and the chucking electrode 45 is connected to ground to remove any accumulated charge. The substrate 12 can be electrically grounded by contacting it with a grounded conductor or by forming a plasma at a reduced power level to provide an electrically conductive path from the substrate to the grounded walls 125 of the chamber 40.

Another example of a process chamber 130 that can use the present chuck 20, as illustrated in FIG. 4, comprises an RPS chamber 130, also commercially available from Applied Materials. In this chamber 130, the plasma is generated using a microwave generator assembly 135 comprising a microwave applicator 140, a microwave tuning assembly 145, and a magnetron microwave generator 150. A suitable microwave applicator 140 is described in Applied Materials U.S. patent application Ser. No. 08/499,984, by Herchen, et al., entitled "MICROWAVE PLASMA BASED APPLICATOR," filed on Jul. 10, 1995, which is incorporated herein by reference. The chuck 20 illustrated in this chamber 130 comprises bipolar electrodes 45a, 45b that includes at least two substantially coplanar electrodes that generate substantially equivalent electrostatic clamping forces. The bipolar electrodes 45a, 45b can form opposing semicircles, or inner and outer rings of electrodes with electrical isolation voids therebetween. The bipolar electrodes 45a, 45b are operated by application of a differential electrical potential to the electrodes that induces opposing electrostatic charges in the substrate 12 to electrostatically hold the substrate to the chuck 20.

In a preferred embodiment, a heat transfer gas supply 155 provides heat transfer gas to the receiving surface 35 of the chuck 20 to control the temperature of the substrate 12. In this version, the chuck 20 comprises (i) a gas channel 160 for holding heat transfer gas in the chuck 20, (ii) a gas feed 170 for providing heat transfer gas to the gas channel, and (iii) gas vents 165 extending from the channel to the receiving surface 35 for providing heat transfer gas to the receiving surface 35 below the substrate 12. During operation, the heat transfer gas flows into the gas supply channel 160 in the chuck 20, through the gas vents 165, and exits below the receiving surface 35. The heat transfer gas is used to provide efficient heat transfer rates between the substrate 12 and the chuck 20. The substrate 12 covers and seals the peripheral edge of the chuck 20 to reduce leakage of heat transfer gas from below the substrate 12 to maintain the substrate at constant temperatures. Typically, an inert gas such as helium or argon is supplied at a pressure of about 5 to about 30 Torr.

In another aspect of the present invention, illustrated schematically in FIG. 4, a fluid system 175 is used to regulate the temperature of the substrate and support. It should be noted that the fluid system 175 can be used in any dielectric member supporting a substrate 12, and should not be limited to use in monocrystalline ceramic chucks that are used only to provide illustrative examples of the present invention. The fluid system 175 comprises (i) a fluid conduit 180 for holding or circulating heat transfer fluid below the receiving surface 35 of the chuck 20, (ii) a fluid inlet 185 for supplying heat transfer fluid to the conduit 180, and (iii) a fluid outlet 190 for removing or exhausting the heat transfer fluid from the chuck 20. Preferably, the fluid conduit 180 is embedded in the body of the chuck 20 to provide more control over the temperature of the chuck 20, particularly when the chuck is made of low thermal conductance ceramic material, such as aluminum oxide or sapphire. During operation, a fluid supply 205 supplies cooled or heated fluid to the fluid inlet 185 of the fluid conduit 180. The fluid pumped to the fluid inlet 185 circulates through the fluid conduit 180 to heat or cool the body of the chuck 20 (depending on the difference in temperature between the fluid and the chuck), and is removed or exhausted from the fluid outlet 190. By being placed inside the chuck, the fluid conduit 180 provides more effective temperature adjustment response times and higher heat transfer rates, than conventional chucks in which a fluid system was used to control the temperature of a separate metal cathode or base below the body of the chuck.

Figure 7A:
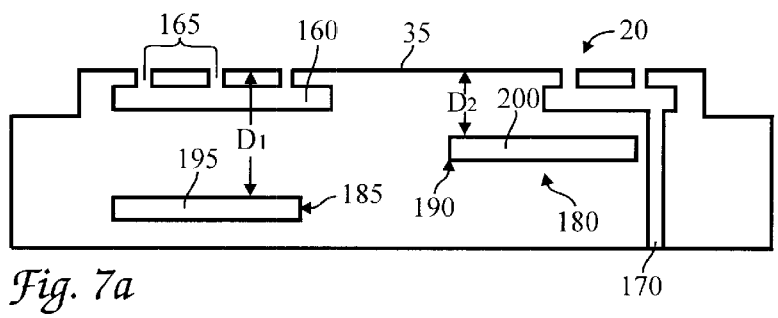
FIGS. 7a to 7e are schematic sectional views showing preferred fluid conduit arrangements of the present invention.

Preferably, the fluid conduit 180 in the body of the chuck 20 comprises first passageways 195 at a first distance $D_1$ from the receiving surface 35 and second passageways 200 at a second distance $D_2$ from the receiving surface 35, as for example, illustrated in FIG. 7a. The difference $\Delta D$ in the distances $D_1$ and $D_2$ is selected to provide a uniform rate of heat transfer from the receiving surface 35 to the conduits 180, even though the fluid is being heated or cooled by the chuck 20 as it travels through the chuck. The distance $D_1$ is sufficiently greater or smaller than the distance $D_2$ to compensate for the equilibrium temperatures of the fluid as it enters the chuck through the fluid inlet 185 and exits the chuck through the fluid outlet 190. The distance $D_1$ is sufficiently greater or smaller than the distance $D_2$ to compensate for any difference in temperature $\Delta T$ which would otherwise cause dissimilar rates of heat transfer from different portions of the receiving surface 35. In one embodiment, the first passageways 195 are positioned adjacent to the fluid inlet 185, while the second passageways 200 are positioned adjacent to the fluid outlet 190. This compensates for the greater difference in temperature $\Delta T$ between the receiving surface 35 and the fluid entering the body of the chuck than that between the receiving surface 35 and the fluid exiting the chuck 20. To maintain substantially uniform temperatures across the surface of the chuck 20, the inlet 185 is positioned further away from the receiving surface 35 than the outlet 190. For example, as shown in FIG. 7a, the fluid conduit 180 comprises a helical conduit that rises toward the receiving surface 35 as it proceeds from the fluid inlet 185 to the fluid outlet 190, with the distance $D_1$ being sufficiently greater than the distance $D_2$ to provide uniform rates of thermal transfer across the receiving surface of the chuck 20.

The fluid conduit 180 with the first and second passageways 195, 200 also provides more precise control of the temperature of the substrate 12 by compensating for variations in the calorific heat or heat conductance across the body of the chuck 20, which is a particular problem for ceramic chucks that have different materials or internal shapes and structures therein, such as the electrodes, channels and conduits. The first and second passageways 195, 200 can form any suitable structure forming a continuous conduit 180 through the body of the chuck, as apparent to one of ordinary skill in the art, that will provide the desired difference (or uniformity) in temperatures across the receiving surface 35. For example, the fluid conduit 180 can be shaped as discrete segments having polyhedra or rectangular shaped cross-sections below the substrate receiving surface 35, angled or angular segments that are positioned at an acute or obtuse angle to the substrate receiving surface 35, or segments of a continuous conduit which ascends helically from the perimetric portion to the central portion of the chuck, or vice-versa.

Figure 7B:
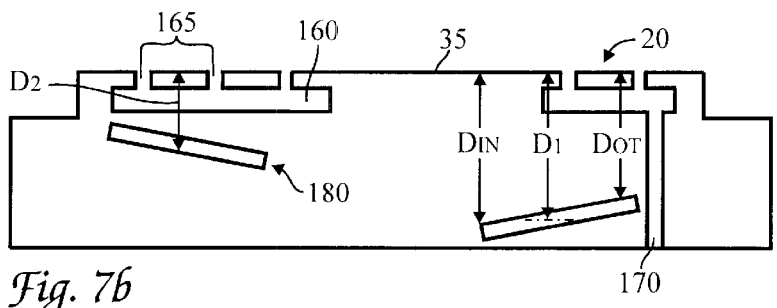
Figure 7C:
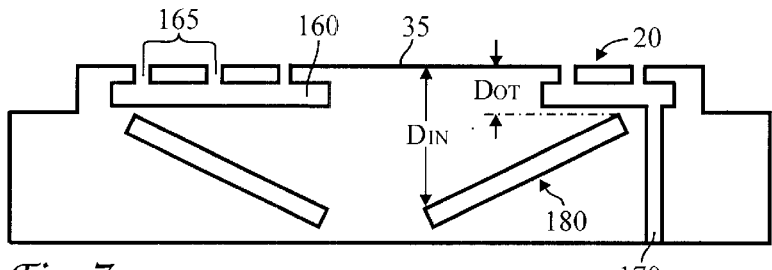

The temperature profile across the substrate 12 held on the receiving surface 35 can be further controlled by controlling the difference between the distance $D_{IN}$ which is the distance between the receiving surface 35 and the radially inner portion of the conduit 180, and the distance $D_{OT}$ which is the distance between the receiving surface 35 and the radially outer or perimetric portion of the conduit. The difference in the distances $D_{IN}$ and $D_{OT}$ is selected based on the difference in equilibrium temperatures at the receiving surface of the chuck, and can be used to design a conduit in conjunction with the distances $D_1$ and $D_2$, or independently. For example, FIG. 7b shows a conduit where both the distances $D_{IN}$ and $D_{OT}$ and the distances $D_1$ and $D_2$ were tailored to achieve a uniform temperature across the substrate. FIGS. 7c and 7e illustrate additional fluid conduits 180 comprising an outer circumferential diameter $D_{OT}$ at the perimeter of the chuck that is closer to the receiving surface 35 than an inner circumferential diameter $D_{IN}$ near the center of the chuck. This arrangement of the fluid conduit 180 provides increased heat transfer from the peripheral portion of the chuck 20, and is useful when the peripheral portion operates at hotter steady state or equilibrium temperatures than the central portion of the chuck, so that the cooling fluid can cool the peripheral portion at higher cooling rates than the center. Alternatively, when the central portion of the chuck is hotter than the peripheral portion, the fluid conduit 180 has the shape shown in FIG. 7d, where the inner circumferential diameter $D_{IN}$ near the center of the chuck is closer to the receiving surface 35 than the outer circumferential diameter $D_{OT}$, and the distance $D_{IN}$ is less than the distance $D_{OT}$.

Figure 7D:
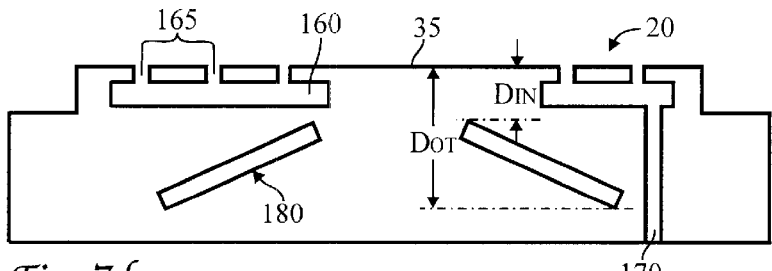
Figure 7E:
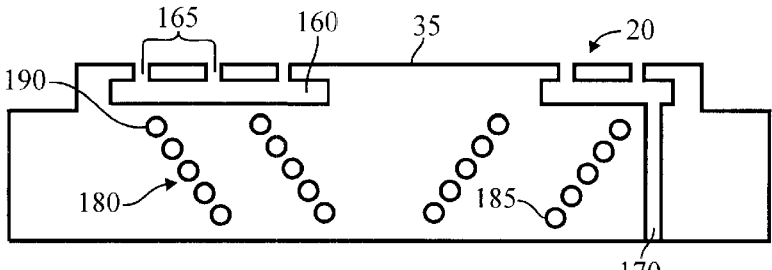

In one preferred embodiment, the fluid conduit 180 comprises an annular ring that extends circumferentially through the chuck 20 and has a rectangular cross-section with a central axis inclined to the plane of the receiving surface 35, as shown in FIGS. 7b through 7d. The angular orientation of the annular ring relative to the receiving surface is selected to maintain a substantially uniform temperature across from the perimeter to the center of the receiving surface of the chuck 20. The annular ring has an inner circumferential edge at a distance $D_{IN}$ from the receiving surface 35, and an outer circumferential edge at a distance $D_{OT}$ from the receiving surface 35. In another version shown in FIG. 7e, the fluid conduit 180 comprises one or more passages having a circular cross-section that form an ascending spiral about a central vertical axis through the chuck 20. Other equivalent fluid conduit structures and configurations, as apparent to one of ordinary skill in the art, are also within the scope of the present invention.

One method of fabricating the chuck 20 comprises a melt forming and seeding process that produces a monolithic structure comprising a monolith of large crystals 30 covering an electrode 45 or having the electrode embedded therein. Preferably, the monolithic structure 25 comprises integral bonding interconnects that comprise large oriented crystals extending through apertures in the electrode 45. The integral bonding interconnects or posts extend from the material above the electrode 45, through the apertures in the electrode 45, to connect directly to the underlying material to form a strong and cohesive structure. The bonding interconnects are formed when molten ceramic seeps into the apertures of the electrode 45 to form a continuous and chemically bonded ceramic structure enclosing the electrode 45. The apertures in the electrode 45 are sized sufficiently small to provide an electrode capable of electrostatically holding the substrate 12 upon application of a voltage to the electrode, and sufficiently large to allow bonding compound or interconnects within the apertures to securely bond the monocrystalline material around the electrode. Preferably, the thickness t of the layer of monocrystalline ceramic grains above the electrode 45 is at least about three times the diameter of the apertures in the electrode 45 to reduce spreading of the electric field from the electrode.

Figure 6A:
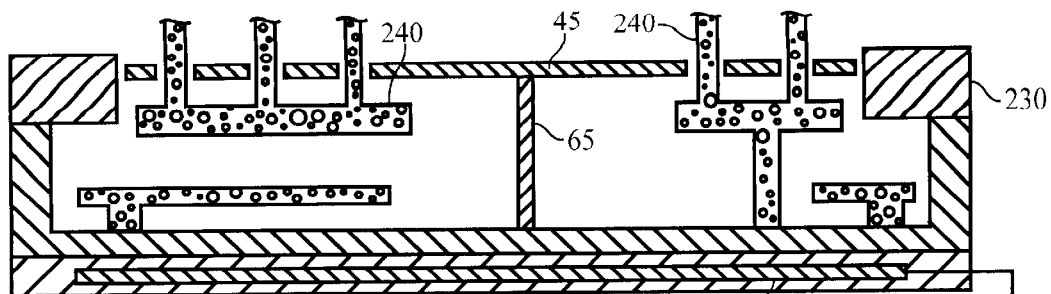
FIGS. 6a to 6d are schematic sectional views showing the successive steps used to fabricate the electrostatic chuck of FIG. 2a using directional solidification of a molten ceramic in a tank.

The melt process uses a melt apparatus comprising a heated mold 230 for melting a ceramic material for forming a molten ceramic, as shown in FIG. 6a. The sidewalls of the heated mold 230 are surrounded by ceramic fiber insulation (not shown), and include a conventional heater 235, such as tungsten wire, extending through or wrapped around the mold. The mold 230 is preferably fabricated from a material that uniformly wets the molten ceramic material with a contact angle of less than about 90°. Also, because the molten ceramic should not be contaminated by dissolution of mold material into the melt, a high melting point, chemically stable material is used to form the mold 230. For sapphire chucks, the mold 230 is preferably made of a high temperature corrosion resistant material such as molybdenum, which has a melting point of 2617° C., uniformly wets molten alumina, and has a low reactivity and high chemical compatibility with molten alumina. The insulation around the mold comprises a cylinder of ceramic insulation surrounding the mold 230 and covering the workpiece surface. Suitable ceramic insulation including ZIRCAR fibers, commercially available from ZIRCAR Company, New York. Cooling tubes that contain a heat transfer fluid, such as water or helium gas, can also be provided around the mold and over the workpiece surface to provide a source of rapid heat dissipation (not shown).

One or more chemically degrading and etchable forms 240 are shaped to form the channels 160, 165, 170, and conduits 180 in the chuck 20. The forms 240 and the electrode 45 of the chuck 20 are held suspended in the molten ceramic material by fine alumina fibers or supported by alumina blocks. The chemically degrading forms 240 comprise a material that can be etched by a gas or liquid to remove the material. For example, the chemically degrading forms 240 can comprise a wet chemical etchable material that is etched away in a wet chemical solution, such as for example, nitric acid. As another example, the chemically degrading forms 240 comprise graphite that can be burned out by oxidation to form the conduits 180, channels 160, 165, 170, and inlet and outlet holes 185, 190 in the chuck 20.

During solidification of the molten ceramic in the mold 230, a seeding crystal 245 is contacted against the surface of the melt to seed or nucleate growth of a monocrystalline ceramic from the molten ceramic material. The seeding crystal 245 typically comprises a surface that has the same composition as the monocrystalline ceramic material. Because the seed crystal has an oriented crystallographic structure it serves as a seeding or nucleating surface that initiates growth of a monocrystalline ceramic. The surface of the melt is then slowly cooled while the sidewalls and bottom of the mold 230 are continuously heated by powering the heater. This allows the monocrystalline ceramic to directionally solidify and grow outwardly from the seed crystal 245, to form a monolith that is conformal and confined to the internal shape of the mold 240. The temperature of the mold and the molten ceramic is controlled by a temperature control system 250 that continuously heats the molten material in the mold 230 while the surface of the molten material is cooled in the direction from the surface toward the base of the mold. Slowly reducing the heat applied to the molten material allows the molten ceramic to form a monolith comprising large, highly oriented crystals 30.

After cooling, the solidified monolithic structure 25 comprising a monolith of monocrystalline ceramic material is removed from the mold 230 and treated to remove the chemically degradable forms 240, to create conduits and channels between the ceramic crystals 30 without damaging the electrode 45 in the chuck 20. Chemically etchable forms 240 are etched by a suitable chemical, such as a bath of strong acid, in which the chuck 20 is immersed for about 24 hours. Chemically degradable forms 240, such as graphite, are removed through oxidation by simply heating the chuck 20 to a high temperature of about 700° C. in air or an oxygen containing atmosphere for about 120 minutes. When oxidation is used to remove the chemically degradable forms 240, care should be used to prevent unwanted oxidation of the electrode 45. For example, when the electrode 45 is made from a refractory metal, the electrode form should be flushed or purged with inert gas to prevent oxidation and cracking of the electrode.

Figure 6B:
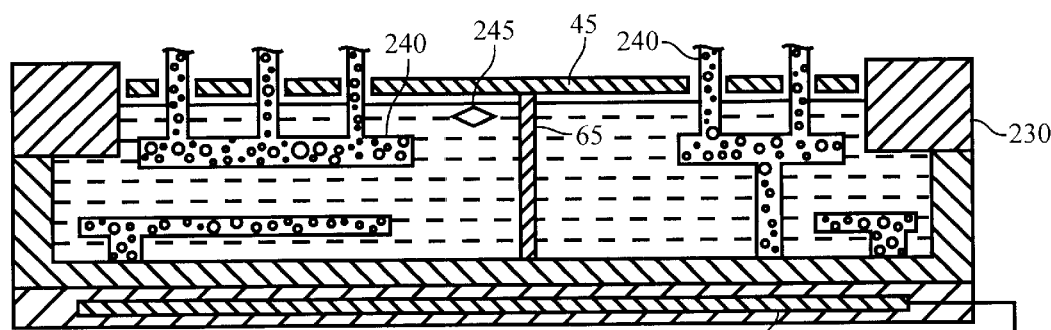
Figure 6C:
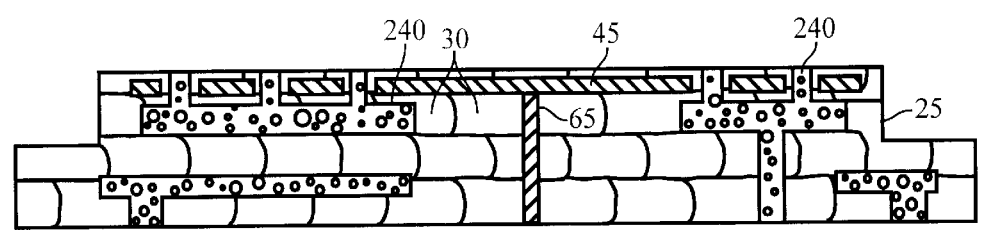
Figure 6D:
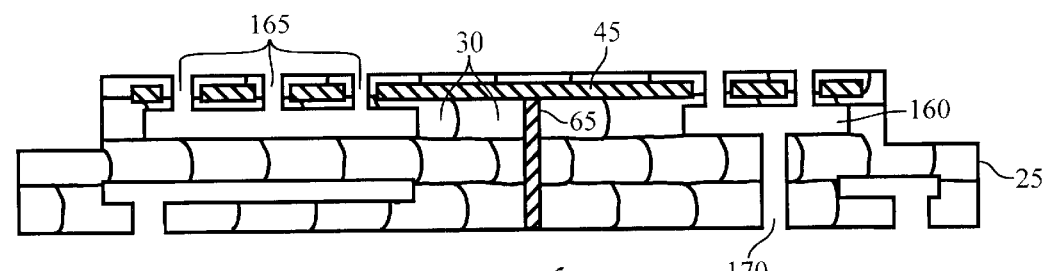

Several different methods can be used to form the electrode 45 in the chuck 20. In one method, as illustrated in FIGS. 6a to 6c, a refractory metal electrode is suspended in the molten ceramic to become embedded in the monocrystalline monolith of the monolithic structure 25. Suitable electrodes include, for example, a refractory metal electrode 45 formed from metal foil using conventional bonding, stamping, or pressing methods; metal wire joined together in an interconnected pattern to form a mesh of electrically conductive wire; or a metal plate that is etched to form the desired electrode pattern. Alternatively, the electrode 45 can also be formed by altering the crystalline lattice structure of the monocrystalline monolithic structure 25 in a predefined pattern to form a conductive electrode pattern on the crystal structure. In this method, lattice defects are introduced in the monocrystalline ceramic using a laser focused inside the monolithic structure 25. Suitable laser methods can use a Nd YAG laser having an intensity of $10^8$ Watts/cm$^2$ that is scanned across the monocrystalline ceramic to form electrically conducting lattice defects within the monocrystalline ceramic. The lattice defects typically comprise dislocations, which occur when atoms are moved from their initial crystalline positions to interstitial or other lattice sites. In yet another method, the electrode 45 is formed by doping the monolithic structure 25 with suitable dopants to provide the desired electrical properties such as resistivity and dielectric breakdown strength. For example, a sapphire monocrystalline ceramic material can be doped with 0.1 to 5 wt % $TiO_2$, in a conductive pattern suitable for use as an electrode 45. Conventional photolithographic and ion implantation methods can also be used to form a patterned layer of dopant on a sapphire layer.

Another version of the chuck 20 comprises a plurality of monocrystalline ceramic plates 270 bonded to one another to form a monolith comprising structure as shown in FIG. 2b. The electrode 45 is covered by or embedded in the monolithic structure 25 monolith comprising structure, and an electrical connector 50 extends through one or more plates to supply a voltage to the electrode. Typically, the monocrystalline ceramic plates 270 comprise a thickness of about 0.1 to 1 cms, and more preferably 0.1 to 0.25 cms (0.04 to 0.10 inches) with a plurality of bonding regions between the plates that typically have a thickness of about 0.0001 to 0.0050 inches. The monolith comprising structure comprises from about 2 to about 30 monocrystalline ceramic plates 270. One or more of the monocrystalline ceramic plates 270 have machined therein (i) a gas channel 160 for holding heat transfer gas in the chuck, (ii) a gas feed 170 for providing heat transfer gas to the gas channel, and (iii) gas vents 165 extending from the channel for providing heat transfer gas to a surface of the chuck below the substrate 12. The monocrystalline ceramic plates 270 can also have machined therein a fluid conduit 180, fluid inlet 185, and fluid outlet 190. The monocrystalline ceramic plates 270 are aligned to one another so that the gas channels 160, gas feeds 170, and gas vents 165 form the gas distribution system in the chuck; and the fluid conduit 180, fluid inlet 185, and fluid outlet 190 form a separate fluid based heat transfer system that is used to regulate the temperature of the chuck 20.

Figure 5A:
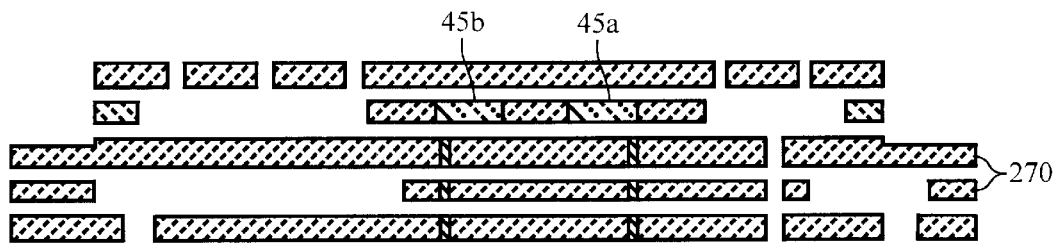
FIGS. 5a to 5c are exploded schematic sectional views of an assembly of precut monocrystalline ceramic plates and electrodes used to form an electrostatic chuck.
Figure 5B:
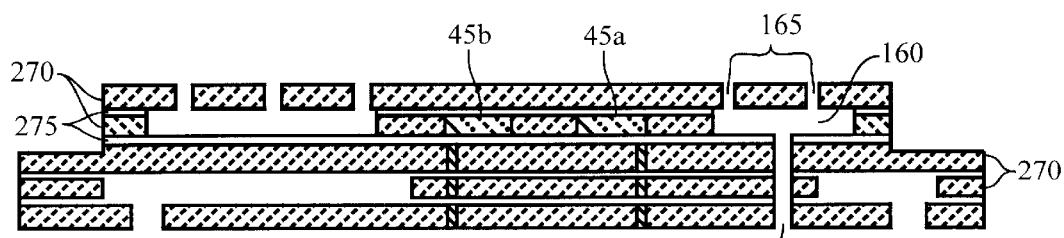
Figure 5C:
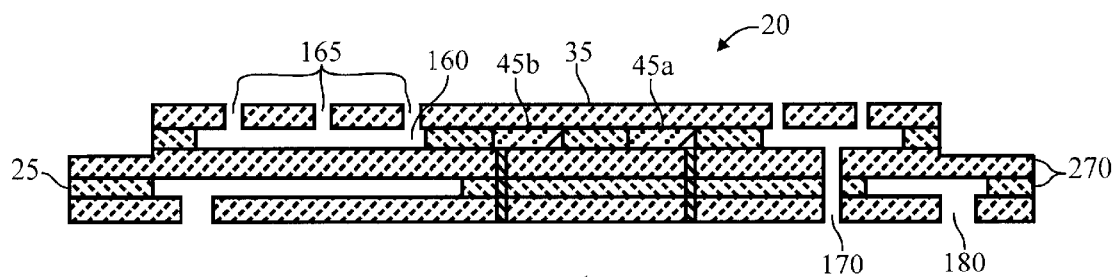

The method of fabricating an electrostatic chuck 20 which comprises a plurality of monocrystalline ceramic plates 270, will now be described with reference to FIGS. 5a and 5c. Conventional crystal growth techniques, such as the Czochralski or EFG methods, in which a crystal of ceramic is seeded from molten ceramic, are used to grow monocrystalline ceramic. The monocrystalline ceramic is cut into a number of monocrystalline ceramic plates 270 comprising large aluminum oxide crystals substantially oriented with respect to one another. An electrode 45 comprising a metal structure, a dopant pattern, or a pattern of lattice defects is formed on one or more of the monocrystalline ceramic plates 270, as described above. The monocrystalline ceramic plates 270 are bonded to one another to form a monolith comprising structure of monocrystalline ceramic plates 270 using a bonding compound 275 comprising an eutectic mixture of aluminum oxide and an eutectic component. The eutectic mixture is used to provide an aluminum-containing bonding material 275 which matches the thermal expansion coefficient of the monocrystalline ceramic material and melts at a relatively low temperature. By eutectic component it is meant an additive, or mixture of additives, that form an eutectic or glassy system with aluminum oxide that has a melting temperature that is significantly lower than that of pure aluminum oxide, preferably less than about 2000° C., and more preferably less than about 1800° C. Preferred eutectic components include for example $B_2O_3$, $P_2O_5$, and $SiO_2$.

Several different methods can be used to form a metal electrode 45 on one of the monocrystalline ceramic plates 270. In one method, a patterned layer of resist is formed on the monocrystalline ceramic plate 270, and metal deposited between the resist features (for example, by electroplating or sputtering) to form an electrode structure. Suitable resist materials include "RISTON" fabricated by DuPont de Nemours Chemical Co, and conventional photolithographic methods are described in *Silicon Processing for the VLSI Era, Volume 1: Process Technology*, Chapters 12, 13, and 14, by Stanley Wolf and Richard N. Tauber, Lattice Press, California (1986), which is incorporated herein by reference. Alternatively, the electrode 45 can be fabricated by etching a layer of metal deposited on a sapphire plate using conventional PVD, CVD, or solution deposition methods, such as for example metal CVD or sputtering. Conventional photolithographic and etching methods are used to etch the deposited metal into the desired electrode configuration. The electrode 45 can also be formed on a wafer of monocrystalline ceramic material cut from a column of monocrystalline ceramic by altering the lattice structure of the ceramic wafer in a predefined pattern to form a conductive electrode pattern, or by doping the monocrystalline ceramic with suitable dopants to provide the desired electrical properties such as resistivity and dielectric breakdown strength.

After forming the electrode 45 on the monocrystalline ceramic plate 270, such as a sapphire plate, one or more of the sapphire plates are machined to form the gas channel 160, gas feed 170, and gas vents 165, as well as the fluid conduit 180, fluid inlet 185, and fluid outlet 190 in different sapphire plates, and in such relationship to one another as to form the desired configuration of helium gas heat transfer system, and fluid cooling or heating system in the chuck 20. The various holes and channels in the sapphire plates are aligned to one another during assembly of the plates so that the gas channel 160, gas feed 170, and gas vents 165; or the conduit 180, inlet 185, and outlet 190, cooperate with one another to form the desired conduit structure.

While the present invention has been described in considerable detail with reference to certain preferred versions, many other versions should be apparent to those of ordinary skill in the art. For example, the monocrystalline ceramic can be fabricated by grain growth of polycrystalline ceramic material or by other suitable melt forming methods. Also, the electrode and other shapes can be formed by other methods, for example, by drilling or machining a monocrystalline ceramic and inserting the desired shapes and forms. Therefore, the spirit and scope of the appended claims should not be limited to the description of the preferred versions contained herein.

What is claimed is:

1. An electrostatic chuck capable of holding a substrate in a process chamber, the electrostatic chuck comprising:
   (a) a monolith of monocrystalline ceramic having a surface adapted to receive the substrate;
   (b) an electrode in the monolith, the electrode adapted to electrostatically hold the substrate upon application of a voltage to the electrode; and
   (c) an electrical connector capable of supplying the voltage to the electrode, the electrical connector extending through the monolith.

2. The electrostatic chuck of claim 1 wherein the monocrystalline ceramic comprises large crystals having a diameter from about 0.5 to about 10 cm, that are oriented in substantially a single crystallographic direction.

3. The electrostatic chuck of claim 2 wherein the monocrystalline ceramic comprises $Al_2O_3$, AlN, $BaTiO_3$, BeO, BN, CaO, $LaB_6$, MgO, $MoSi_2$, $Si_3N_4$, $SiO_2$, $Ta_2O_5$, $TiB_2$, TiN, $TiO_2$, $TiSi_2$, $VB_2$, $W_2B_3$, $WSi_2$, $ZrB_2$, or $ZrO_2$ or mixtures thereof.

4. The electrostatic chuck of claim 1 wherein the monocrystalline ceramic comprises sapphire.

5. The electrostatic chuck of claim 1 further comprising (i) a gas channel for holding heat transfer gas in the electrostatic chuck, (ii) a gas feed for providing heat transfer gas to the gas channel, and (iii) one or more gas vents extending from the gas channel to the surface for providing heat transfer gas below the substrate.

6. The electrostatic chuck of claim 1 further comprising (i) a fluid conduit adapted to circulate heat transfer fluid in the electrostatic chuck, (ii) a fluid inlet adapted to supply heat transfer fluid to the fluid conduit, and (iii) a fluid outlet adapted to remove the heat transfer fluid.

7. The electrostatic chuck of claim 6 wherein the fluid conduit comprises first passageways at a distance D1 from the surface and second passageways at a distance D2 from the surface, the distance D1 being greater than the distance D2.

8. The electrostatic chuck of claim 7 wherein the fluid conduit comprises an axis that is at an angle to the surface.

9. The electrostatic chuck of claim 7 wherein the first passageways are adjacent to the fluid inlet and the second passageways are adjacent to the fluid outlet.

10. The electrostatic chuck of claim 9 wherein the fluid conduit rises toward the surface from the fluid inlet to the fluid outlet.

11. The electrostatic chuck of claim 1 wherein the electrode comprises a refractory metal.

12. The electrostatic chuck of claim 1 wherein the monolith comprises one or more monocrystalline ceramic plates, and wherein the electrode comprises at least one of the following:
   (a) dopant in a monocrystalline ceramic plate; or
   (b) lattice defects in a monocrystalline ceramic plate.

13. A process chamber comprising the electrostatic chuck of claim 1, the process chamber further comprising:
   (a) a gas distributor; and
   (b) an exhaust,
whereby a substrate held on the electrostatic chuck is capable of being processed by gas distributed by the gas distributor and exhausted by the exhaust.

14. A method for fabricating an electrostatic chuck, the method comprising the steps of:
   (a) melting ceramic material in a mold to form molten ceramic, the mold having an internal shape of the electrostatic chuck;
   (b) holding one or more of electrode forms, channel forms, and conduit forms in the molten ceramic;
   (c) maintaining a seeding crystal in contact with the molten ceramic;
   (d) cooling the molten ceramic to form monocrystalline ceramic comprising large crystals substantially oriented to one another, and having the electrode forms, channel forms, or conduit forms embedded therein; and
   (e) treating one or more of the electrode forms, channel forms, or conduit forms in the monocrystalline ceramic to form an electrode, channel, or conduit.

15. The method of claim 14 wherein step (d) comprises cooling the surface of the molten ceramic in a direction that proceeds outwardly from the seeding crystal.

16. The method of claim 14 wherein in step (c) the seeding crystal is contacted against an exposed surface of the molten ceramic in the mold, and in step (d) the exposed surface of the molten ceramic is cooled while walls of the mold are heated.

17. The method of claim 14 wherein the electrode forms comprise refractory metal.

18. The method of claim 14 wherein the conduit forms and channel forms are made from:
   (1) a chemically etchable material that can be etched away without damaging the monocrystalline ceramic; or
   (2) an oxidizable material that can be oxidized away without damaging the monocrystalline ceramic.

19. The method of claim 14 wherein the conduit forms or channel forms are made from graphite, and wherein in step (e) the graphite is removed by oxidation to provide hollow channels and conduits in of monocrystalline ceramic.

20. An electrostatic chuck formed by the method of claims 14.

21. The electrostatic chuck of claim 20 wherein the monocrystalline ceramic comprises sapphire.

22. An intermediate product for fabricating an electrostatic chuck, the intermediate product comprising a monolith of monocrystalline ceramic having one or more chemically degradable forms that are shaped to form channels and fluid conduits.

23. The intermediate product of claim 22 wherein the monocrystalline ceramic comprises Al2O3, AlN, BaTiO3, BeO, BN, CaO, LaB6, MgO, MoSi2, Si3N4, SiO2, Ta2O5, TiB2, TiN, TiO2, TiSi2, VB2, W2B3, WSi2, ZrB2, or ZrO2 or mixtures thereof.

24. The intermediate product of claim 22 wherein the monocrystalline ceramic comprises sapphire.

25. The intermediate product of claim 22 wherein the chemically degradable forms comprise material that can be etched away by a gas or liquid.

26. The intermediate product of claim 25 wherein the chemically degradable forms comprise graphite.

27. An electrostatic chuck capable of holding a substrate, the electrostatic chuck comprising:
   (a) first and second monocrystalline plates and a ceramic material between the monocrystalline plates, at least one of the monocrystalline plates having a surface adapted to receive the substrate and the ceramic material comprising an eutectic mixture of aluminum oxide and an eutectic compound;
   (b) an electrode; and
   (c) an electrical connector adapted to supply a voltage to the electrode, the electrical connector extending through at least one of the monocrystalline plates.

28. The electrostatic chuck of claim 27 wherein each of the monocrystalline plates comprise large crystals that are oriented relative to one another, the crystals having an average diameter of from about 0.5 to about 10 cm.

29. The electrostatic chuck of claim 27 wherein the monocrystalline plates comprise sapphire.

30. The electrostatic chuck of claim 27 wherein the eutectic mixture has a melting temperature of less than about 2000° C.

31. The electrostatic chuck of claim 27 wherein at least one of the monocrystalline plates has a thickness of from about 0.1 to about 1 cm.

32. The electrostatic chuck of claim 27 wherein at least one of the monocrystalline plates comprises (i) a gas channel for holding heat transfer gas in the electrostatic chuck, (ii) a gas feed for providing heat transfer gas to the gas channel, and (iii) one or more gas vents extending from the gas channel to the surface for providing heat transfer gas below the substrate.

33. The electrostatic chuck of claim 27 wherein one or more of the monocrystalline plates comprise (i) a fluid conduit adapted to circulate heat transfer fluid in the electrostatic chuck, (ii) a fluid inlet adapted to supply heat transfer fluid to the fluid conduit, and (iii) a fluid outlet adapted to remove the heat transfer fluid.

34. The electrostatic chuck of claim 33 wherein the fluid conduit comprises first passageways at a distance $D_1$ from the surface and second passageways at a distance $D_2$ from the surface, the distance $D_1$ being greater than the distance $D_2$.

35. The electrostatic chuck of claim 34 wherein the first passageways are adjacent to the fluid inlet and the second passageways are adjacent to the fluid outlet.

36. The electrostatic chuck of claim 35 wherein the fluid conduit rises toward the surface from the fluid inlet to the fluid outlet.

37. The electrostatic chuck of claim 33 wherein the fluid conduit comprises an axis that is at an angle to the surface.

38. The electrostatic chuck of claim 27 wherein the electrode comprises at least one of the following:
   (a) dopant in one or more monocrystalline plates; or
   (b) lattice defects in one or more monocrystalline plates.

39. The electrostatic chuck of claim 27 wherein the electrode comprises a refractory metal.

40. A process chamber comprising the electrostatic chuck of claim 27, the process chamber further comprising:

(a) a gas distributor; and (b) an exhaust, whereby a substrate held on the electrostatic chuck is capable of being processed by gas distributed by the gas distributor and exhausted by the exhaust.

41. The electrostatic chuck of claim 27 wherein the ceramic material is in a bond material.

42. The electrostatic chuck of claim 27 wherein the ceramic material comprises aluminum oxide.

43. A method of forming an electrostatic chuck, the method comprising the steps of:

(a) forming a plurality of monocrystalline ceramic plates comprising large aluminum oxide crystals oriented to one another;

(b) forming an electrode on one of the monocrystalline ceramic plates; and (c) bonding the monocrystalline ceramic plates to one another with a bond material comprising a ceramic comprising an eutectic mixture of aluminum oxide and an eutectic component, at least one of the monocrystalline ceramic plates having a surface adapted to receive the substrate.

44. The method of claim 43 wherein step (c) comprises the steps of applying a bonding material to the monocrystalline ceramic plates and heat treating the bonding material.

45. The method of claim 44 wherein the eutectic mixture has a melting temperature of less than about 2000° C.

46. The method of claim 43 wherein step (a) comprises forming in one or more of the monocrystalline ceramic plates: a gas channel adapted to hold heat transfer gas in the electrostatic chuck, a gas feed adapted to provide heat transfer gas to the gas channel, and one or more gas vents adapted to provide heat transfer gas to a surface of the electrostatic chuck; and wherein step (c) comprises the initial step of aligning the gas channel, gas feed, and gas vents to one another.

47. The method of claim 43 wherein step (a) comprises forming in one or more of the monocrystalline ceramic plates: a fluid conduit adapted to hold heat transfer fluid, a fluid inlet adapted to supply heat transfer fluid to the fluid conduit, and a fluid outlet adapted to exhaust the heat transfer fluid; and wherein step (c) comprises the initial step of aligning the fluid conduit, fluid inlet, and fluid outlet to one another.

48. The method of claim 47 wherein step (a) comprises the step of forming a fluid conduit having first passageways at a distance $D_1$ from the surface and second passageways at a distance $D_2$ from the surface, the distance $D_1$ being greater than the distance $D_2$.

49. The method of claim 48 comprising positioning the first passageways adjacent to the fluid inlet and the second passageways adjacent to the fluid outlet.

50. The method of claim 43 wherein in step (b), the electrode is formed by at least one of the following steps:

(1) doping a monocrystalline ceramic plate with a dopant to form a conducting pattern;

(2) forming a pattern of lattice defects on a monocrystalline ceramic plate; or (3) applying a pattern of electrical conductor material on a monocrystalline ceramic plate.

51. The method of claim 43 wherein in step (b), the electrode is formed on the monocrystalline ceramic plate by at least one of the following steps:

(i) attaching a mesh electrode to the monocrystalline ceramic plate;

(ii) depositing a metal layer on the monocrystalline ceramic plate and etching the deposited metal layer; or (iii) forming a pattern of resist features on the monocrystalline ceramic plate and depositing metal between the resist features.

52. The method of claim 43 wherein the electrode comprises a refractory metal.

53. The method of claim 43 wherein the electrode comprises apertures sized sufficiently small to form an electrode capable of electrostatically holding the substrate upon application of a voltage to the electrode, and sufficiently large to allow bonding material in the apertures to securely bond the monocrystalline ceramic plates to one another.

54. An electrostatic chuck formed by the method of claim 43.

55. The method of claim 43 wherein the electrode is between the monocrystalline plates.

56. The method of claim 43 wherein the bond material is about the periphery of the electrode.

57. An electrostatic chuck capable of holding a substrate, the electrostatic chuck comprising:

(a) a ceramic monolith having a surface capable of receiving the substrate; and (b) an electrode in the ceramic monolith for electrostatically holding the substrate upon application of a voltage to the electrode.

58. The electrostatic chuck of claim 49 wherein the ceramic monolith comprises a monocrystalline material.

59. The electrostatic chuck of claim 58 wherein the monocrystalline material comprises large crystals having a diameter of from about 0.5 to about 10 cm, and that are oriented in substantially a single crystallographic direction.

60. The electrostatic chuck of claim 58 wherein the monocrystalline material comprises Al2O3, AlN, BaTiO3, BeO, BN, CaO, LaB6, MgO, MoSi2, Si3N4, SiO2, Ta2O5, TiB2, TiN, TiO2, TiSi2, VB2, W2B3, WSi2, ZrB2, ZrO2 or mixtures thereof.

61. The electrostatic chuck of claim 58 wherein the monocrystalline material comprises sapphire.

62. The electrostatic chuck of claim 57 further comprising a gas channel for holding heat transfer gas in the electrostatic chuck, a gas feed for providing heat transfer gas to the gas channel, and one or more gas vents extending from the gas channel to the surface for providing heat transfer gas below the substrate.

63. The electrostatic chuck of claim 57 further comprising a fluid conduit for circulating heat transfer fluid in the electrostatic chuck, a fluid inlet for supplying heat transfer fluid to the fluid conduit, and a fluid outlet for removing the heat transfer fluid.

64. The electrostatic chuck of claim 63 wherein the fluid conduit comprises first passageways at a distance $D_1$ from the surface and second passageways at a distance $D_2$ from the surface, the distance $D_1$ being greater than the distance $D_2$.

65. The electrostatic chuck of claim 64 wherein the first passageways are adjacent to the fluid inlet and the second passageways are adjacent to the fluid outlet.

66. The electrostatic chuck of claim 63 wherein the fluid conduit comprises a rectangular cross-section that is at an angle to the plane of the surface.

67. The electrostatic chuck of claim 63 wherein the fluid conduit is helical.

68. The electrostatic chuck of claim 63 wherein the electrode comprises a refractory metal having a melting point of at least about 2200° C.

69. A process chamber comprising the electrostatic chuck of claim 63.

70. An electrostatic chuck capable of holding a substrate, the electrostatic chuck comprising;
(a) a monocrystalline monolith composed of large crystals that are substantially oriented to one another; and
(b) an electrode in the monocrystalline monolith, the electrode being chargeable to electrostatically hold the substrate.

71. The electrostatic chuck of claim 70 wherein the large crystals have diameters of from about 0.5 to about 10 cm.

72. The electrostatic chuck of claim 70 wherein the monocrystalline monolith comprises a ceramic.

73. The electrostatic chuck of claim 70 wherein the monocrystalline monolith comprises $Al_2O_3$, AlN, $BaTiO_3$, BeO, BN, CaO, $LaB_6$, MgO, $MoSi_2$, $Si_3N_4$, $SiO_2$, $Ta_2O_5$, $TiB_2$, TiN, $TiO_2$, $TiSi_2$, $VB_2$, $W_2B_3$, $WSi_2$, $ZrB_2$, $ZrO_2$ or mixtures thereof.

74. The electrostatic chuck of claim 70 wherein the monocrystalline monolith comprises sapphire.

75. The electrostatic chuck of claim 70 wherein the electrode comprises at least one of the following:
(a) a pattern of dopant in the monocrystalline monolith;
(b) a pattern of lattice defects in the monocrystalline monolith; or
(c) a refractory metal.

76. A process chamber capable of processing a substrate, the process chamber comprising:
(a) an electrostatic chuck adapted to hold the substrate, the electrostatic chuck comprising an electrode in a monocrystalline monolith comprising large crystals substantially oriented to one another and having a surface adapted to receive the substrate, and the electrode being chargeable to electrostatically hold the substrate;
(b) a gas distributor having gas inlet holes adapted to provide process gas to the process chamber and optionally a gas energizer capable of coupling energy to the process gas; and
(c) an exhaust that exhausts the process gas from the process chamber.

77. The process chamber of claim 76 wherein the monocrystalline monolith comprises $Al_2O_3$, AlN, $BaTiO_3$, BeO, BN, CaO, $LaB_6$, MgO, $MoSi_2$, $Si_3N_4$, $SiO_2$, $Ta_2O_5$, $TiB_2$, TiN, $TiO_2$, $TiSi_2$, $VB_2$, $W_2B_3$, $WSi_2$, $ZrB_2$, $ZrO_2$ or mixtures thereof.

78. The process chamber of claim 76 further comprising a fluid conduit adapted to circulate heat transfer fluid in the electrostatic chuck, a fluid inlet adapted to supply heat transfer fluid to the fluid conduit, and a fluid outlet adapted to remove the heat transfer fluid.

79. The process chamber of claim 78 wherein the fluid conduit comprises first passageways at a distance $D_1$ from the surface and second passageways at a distance $D_2$ from the surface, the distance $D_1$ being greater than the distance $D_2$.

80. The process chamber of claim 76 wherein the electrode comprises at least one of the following:
(a) a pattern of dopant in the monocrystalline monolith;
(b) a pattern of lattice defects in the monocrystalline monolith; or
(c) a refractory metal.

81. An electrostatic chuck capable of holding a substrate, the electrostatic chuck comprising:
(a) a monolith of monocrystalline ceramic having a surface adapted to receive the substrate, the monocrystalline ceramic having a dopant therein to reduce the electrical resistance of the monocrystalline ceramic; and
(b) an electrode in the monolith of monocrystalline ceramic, the electrode being chargeable for electrostatically holding the substrate.

82. The electrostatic chuck of claim 81 wherein the monolith of monocrystalline ceramic comprises an electrical resistance sufficiently low to cause the substrate to be electrostatically held by non-coulombic electrostatic pressure upon application of a voltage to the electrode.

83. The electrostatic chuck of claim 81 wherein the monocrystalline ceramic comprises large crystals oriented in substantially a single crystallographic direction.

84. The electrostatic chuck of claim 83 wherein the large crystals comprise a diameter of from about 0.5 to about 10 cm.

85. The electrostatic chuck of claim 81 wherein the monocrystalline ceramic comprises $Al_2O_3$, AlN, $BaTiO_3$, BeO, BN, CaO, $LaB_6$, MgO, $MoSi_2$, $Si_3N_4$, $SiO_2$, $Ta_2O_5$, $TiB_2$, TiN, $TiO_2$, $TiSi_2$, $VB_2$, $W_2B_3$, $WSi_2$, $ZrB_2$, $ZrO_2$ or mixtures thereof.

86. The electrostatic chuck of claim 81 wherein the electrode comprises at least one of the following:
(a) a pattern of dopant in the monocrystalline ceramic;
(b) a pattern of lattice defects in the monocrystalline ceramic; or
(c) a refractory metal.

87. An electrostatic chuck capable of electrostatically holding a substrate, the electrostatic chuck comprising:
(a) an electrode that is chargeable to electrostatically hold the substrate; and
(b) means for covering the electrode and reducing contamination of the substrate, the means comprising a monolith comprising monocrystalline material, the electrode being in the monolith.

88. The electrostatic chuck of claim 87 wherein the monocrystalline material comprises a plurality of crystals oriented in substantially a single crystallographic direction.

89. The electrostatic chuck of claim 87 wherein the monocrystalline material comprises large crystals having a diameter of from about 0.5 to about 10 cm.

90. The electrostatic chuck of claim 87 wherein said means and the substrate comprise the same material.

91. The electrostatic chuck of claim 87 wherein said means comprises silicon and the substrate comprises silicon.

92. The electrostatic chuck of claim 27 wherein said means comprises aluminum oxide and the substrate comprises aluminum oxide.

93. An electrostatic chuck capable of holding a substrate in a process chamber, the electrostatic chuck comprising:
(a) a monolith of monocrystalline ceramic having a surface adapted to receive the substrate, the monolith of monocrystalline ceramic comprising large crystals having diameters of from about 0.5 to about 10 cm and that are oriented in substantially a single crystallographic direction;
(b) an electrode in the monolith, the electrode adapted to electrostatically hold the substrate upon application of a voltage to the electrode; and
(c) an electrical connector capable of supplying the voltage to the electrode, the electrical connector extending through the monolith.

94. The electrostatic chuck of claim 93 wherein the monocrystalline ceramic comprises $Al_2O_3$, AlN, $BaTiO_3$, BeO, BN, CaO, $LaB_6$, MgO, $MoSi_2$, $Si_3N_4$, $SiO_2$, $Ta_2O_5$, $TiB_2$, TiN, $TiO_2$, $TiSi_2$, $VB_2$, $W_2B_3$, $WSi_2$, $ZrB_2$, or $ZrO_2$ or mixtures thereof.

95. The electrostatic chuck of claim 93 wherein the monocrystalline ceramic consists essentially of sapphire crystals.

96. The electrostatic chuck of claim 93 further comprising (i) a gas channel for holding heat transfer gas in the chuck, (ii) a gas feed for providing heat transfer gas to the gas channel, and (iii) one or more gas vents extending from the channel to the receiving surface to provide heat transfer gas below the substrate.

97. The electrostatic chuck of claim 93 further comprising (i) a fluid conduit for circulating heat transfer fluid in the chuck, (ii) a fluid inlet for supplying heat transfer fluid to the conduit, and (iii) a fluid outlet for removing the heat transfer fluid.

98. The electrostatic chuck of claim 93 wherein the electrode comprises a metal having a melting point of at least about 2200° C.

99. An electrostatic chuck capable of holding a substrate, the electrostatic chuck comprising:
 (a) a monocrystalline plate covering an electrode;
 (b) a bond material comprising a ceramic, the bond material adjacent the monocrystalline plate, and the bond material comprising an eutectic mixture of aluminum oxide and an eutectic compound; and
 (c) an electrical connector adapted to supply a voltage to the electrode.

100. An electrostatic chuck capable of holding a substrate, the electrostatic chuck comprising:
 (a) a monocrystalline plate covering an electrode, the monocrystalline plate comprising $Al_2O_3$, AlN, $BaTiO_3$, BeO, CaO, $LaB_6$, MgO, $MoSi_2$, $Si_3N_4$, $SiO_2$, $Ta_2O_5$, $TiB_2$, TiN, $TiO_2$, $TiSi_2$, $VB_2$, $W_2B_3$, $WSi_2$, $ZrB_2$, or $ZrO_2$ or mixtures thereof;
 (b) a bond material comprising a ceramic, the bond material adjacent the monocrystalline plate, and the bond material comprising an eutectic mixture of aluminum oxide and an eutectic compound; and
 (c) an electrical connector adapted to supply a voltage to the electrode.

101. An electrostatic chuck according to claim 99 wherein the bond material is adapted to bond the monocrystalline plate to another monocrystalline plate.

102. An electrostatic chuck according to claim 101 wherein the electrode is between the monocrystalline plates.

103. An electrostatic chuck capable of holding a substrate, the electrostatic chuck comprising:
 (a) a monolith of monocrystalline ceramic having a surface adapted to receive the substrate; and
 (b) an electrode in the monolith of monocrystalline ceramic, the electrode comprising a dopant and being chargeable for electrostatically holding the substrate.

104. The electrostatic chuck of claim 103 wherein the monocrystalline ceramic comprises large crystals having a diameter of from about 0.5 to about 10 cm, that are oriented in substantially a single crystallographic direction.

105. The electrostatic chuck of claim 103 wherein the monocrystalline ceramic comprises $Al_2O_3$, AlN, $BaTiO_3$, BeO, BN, CaO, $LaB_6$, MgO, $MoSi_2$, $Si_3N_4$, $SiO_2$, $Ta_2O_5$, $TiB_2$, TiN, $TiO_2$, $TiSi_2$, $VB_2$, $W_2B_3$, $WSi_2$, $ZrB_2$, $ZrO_2$ or mixtures thereof.

106. The electrostatic chuck of claim 103 wherein the monocrystalline ceramic comprises sapphire.

107. The electrostatic chuck of claim 103 further comprising a gas channel for holding heat transfer gas in the electrostatic chuck, a gas feed for providing heat transfer gas to the gas channel, and one or more gas vents extending from the gas channel to the surface for providing heat transfer gas below the substrate.

108. The electrostatic chuck of claim 103 further comprising a fluid conduit for circulating heat transfer fluid in the electrostatic chuck, a fluid inlet for supplying heat transfer fluid to the fluid conduit, and a fluid outlet for removing the heat transfer fluid.

109. The electrostatic chuck of claim 108 wherein the fluid conduit comprises first passageways at a distance $D_1$ from the surface and second passageways at a distance $D_2$ from the surface, the distance $D_1$ being greater than the distance $D_2$.

110. The electrostatic chuck of claim 109 wherein the first passageways are adjacent to the fluid inlet and the second passageways are adjacent to the fluid outlet.

111. The electrostatic chuck of claim 108 wherein the fluid conduit comprises a rectangular cross-section that is at an angle to the plane of the surface.

112. The electrostatic chuck of claim 108 wherein the fluid conduit is helical.

113. The electrostatic chuck of claim 103 wherein the electrode comprises a refractory metal having a melting point of at least about 2200° C.

114. A process chamber comprising the electrostatic chuck of claim 103.

* * * * *